United States Patent
Lin et al.

(10) Patent No.: US 10,613,165 B2
(45) Date of Patent: Apr. 7, 2020

(54) END RING PORT STRUCTURE OF AN ATYPICAL RADIO-FREQUENCY COIL OF A MAGNETIC RESONANCE IMAGING SYSTEM

(71) Applicant: Siemens Healthcare GmbH, Erlangen (DE)

(72) Inventors: Hou Quan Lin, Shenzhen (CN); JianMin Wang, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 47 days.

(21) Appl. No.: 15/878,856

(22) Filed: Jan. 24, 2018

(65) Prior Publication Data
US 2018/0210044 A1   Jul. 26, 2018

(30) Foreign Application Priority Data

Jan. 25, 2017   (CN) .................... 2017 2 0097871 U

(51) Int. Cl.
| | | |
|---|---|---|
| *G01R 33/36* | (2006.01) | |
| *G01R 33/34* | (2006.01) | |
| *G01R 33/38* | (2006.01) | |
| *G01R 33/28* | (2006.01) | |
| *H01G 4/38* | (2006.01) | |

(52) U.S. Cl.
CPC .......... *G01R 33/36* (2013.01); *G01R 33/288* (2013.01); *G01R 33/34076* (2013.01); *G01R 33/3628* (2013.01); *G01R 33/3678* (2013.01); *G01R 33/38* (2013.01); *H01G 4/38* (2013.01)

(58) Field of Classification Search
None
See application file for complete search history.

(56) References Cited

U.S. PATENT DOCUMENTS 6,029,082 A * 2/2000 Srinivasan ....... G01R 33/34046
324/318

* cited by examiner

*Primary Examiner* — Douglas X Rodriguez
(74) *Attorney, Agent, or Firm* — Schiff Hardin LLP

(57) ABSTRACT

An end ring port structure of an atypical coil for a magnetic resonance imaging system, has an end ring, provided with multiple end ring capacitance positions for disposing equivalent capacitances, with a portion of the equivalent capacitances being formed by two or more split capacitors. A first port has a first leg and a second leg, which are each connected to the end ring. A second port has a third leg and a fourth leg, which are each connected to the end ring. A first capacitor bank is arranged on the end ring between an end ring connection point of the first leg and an end ring connection point of the second leg. The first capacitor bank has at least two capacitors not all belonging to the same end ring capacitance position. A second capacitor bank is arranged on the end ring between an end ring connection point of the third leg and an end ring connection point of the fourth leg. The second capacitor bank has at least two capacitors not all belonging to the same end ring capacitance position.

10 Claims, 4 Drawing Sheets

END RING PORT STRUCTURE OF AN ATYPICAL RADIO-FREQUENCY COIL OF A MAGNETIC RESONANCE IMAGING SYSTEM

BACKGROUND OF THE INVENTION

Field of the Invention

The present invention concerns the field of magnetic resonance imaging, in particular an end ring port structure of an atypical radio-frequency (RF) coil, an RF coil assembly, and a magnetic resonance imaging system having such an RF coil assembly.

Description of the Prior Art

Magnetic resonance imaging (MRI) is an imaging modality involving biomagnetics and nuclear spin, which has advanced rapidly with the development of computer technology, electronic circuit technology and superconductor technology. MRI uses a magnetic field and radio frequency (RF) pulses to induce oscillation of processing hydrogen nuclei (i.e. H+) in human tissue, so as to generate RF signals that are processed by a computer to form an image. If an object is placed in a magnetic field and irradiated by suitable electromagnetic energy to produce resonance therein, and electromagnetic signals emitted thereby are then analyzed, it is possible to identify the positions and types of the atomic nuclei of which the object is composed. On this basis, a precise three-dimensional image of the interior of the object can be made. For instance, a moving picture of contiguous slices can be obtained by performing an MRI scan of the human brain, starting at the top of the head and continuing all the way to the foot.

In an MRI system, an RF coil emits RF pulses to bring about magnetic resonance. A local coil receives the magnetic resonance signal, and sends the magnetic resonance signal to a reception coil channel selector (RCCS) and a receiver. As the front end of the signal reception chain, an RF coil plays a decisive role in imaging quality. Compared with other components, RF coils have the advantages of being easy to develop and optimize, and for this reason have always been a focus of activity in the MRI research field. RF coils generally include typical coils and atypical coils. An end ring of a typical coil is circular, whereas an end ring of an atypical coil is non-circular.

In the prior art, each port of a typical coil spans one capacitance position, and only one capacitor is arranged at the spanned capacitance position. By arranging two ports on an end ring at an interval of 90 degrees, electrical orthogonality between the ports can be realized, so as to optimize the homogeneity of the RF field ($B_1$ field).

However, in the case of an end ring port structure of an atypical coil, corresponding research is lacking.

SUMMARY OF THE INVENTION

An end ring port structure of an atypical coil in accordance with the invention has an end ring, provided with multiple end ring capacitance positions at which equivalent capacitances are situated, with a portion of the equivalent capacitances being formed by two or more split capacitors. The end ring port structure further has a first port, having a first leg and a second leg that are each connected to the end ring, and a second port, having a third leg and a fourth leg that are each connected to the end ring. A first capacitor bank is arranged on the end ring between an end ring connection point of the first leg and an end ring connection point of the second leg, the first capacitor bank having at least two split capacitors not all belonging to the same end ring capacitance position. A second capacitor bank is arranged on the end ring between an end ring connection point of the third leg and an end ring connection point of the fourth leg, the second capacitor bank having at least two split capacitors not all belonging to the same end ring capacitance position.

In an embodiment, the first capacitor bank has a first split capacitor and a second split capacitor that are connected in series, and the second capacitor bank has a third split capacitor and a fourth split capacitor that are connected in series.

In another embodiment, the first split capacitor and an adjacent capacitor connected in series with the first split capacitor together form an equivalent capacitance of an end ring capacitance position to which the first split capacitor belongs. Also, the second split capacitor and an adjacent capacitor connected in series with the second split capacitor together form an equivalent capacitance of an end ring capacitance position to which the second split capacitor belongs. The third split capacitor and an adjacent capacitor connected in series with the third split capacitor together form an equivalent capacitance of an end ring capacitance position to which the third split capacitor belongs. The fourth split capacitor and an adjacent capacitor connected in series with the fourth split capacitor together form an equivalent capacitance of an end ring capacitance position to which the fourth split capacitor belongs.

In another embodiment, the first capacitor bank has a first split capacitor, a second split capacitor and a third split capacitor, which are connected in series. The first split capacitor and the second split capacitor belong to the same end ring capacitance position, and the third split capacitor does not belong to the end ring capacitance position to which the first split capacitor and the second split capacitor belong. The second capacitor bank has a fourth split capacitor, a fifth split capacitor and a sixth split capacitor which are connected in series. The fourth split capacitor and the fifth split capacitor belong to the same end ring capacitance position, and the sixth split capacitor does not belong to the end ring capacitance position to which the fourth split capacitor and the fifth split capacitor belong.

In another embodiment, an adjacent capacitor connected in series with the first split capacitor, the first split capacitor and the second split capacitor together form an equivalent capacitance of the end ring capacitance position to which the first split capacitor and the second split capacitor belong The third split capacitor and two adjacent capacitors connected sequentially in series with the third split capacitor together form an equivalent capacitance of an end ring capacitance position to which the third split capacitor belongs. An adjacent capacitor connected in series with the fourth split capacitor, the fourth split capacitor and the fifth split capacitor together form an equivalent capacitance of the end ring capacitance position to which the fourth split capacitor and the fifth split capacitor belong. The sixth split capacitor and two adjacent capacitors connected sequentially in series with the sixth split capacitor together form an equivalent capacitance of an end ring capacitance position to which the sixth split capacitor belongs.

An atypical coil assembly in accordance with the invention has an atypical coil having an end ring, the end ring being provided with multiple end ring capacitance positions for disposing equivalent capacitances, with a portion of the equivalent capacitances being formed by two or more split capacitors. A first port has a first leg and a second leg, which are each connected to the end ring. A second port has a third leg and a fourth leg, which are each connected to the end ring. A first capacitor bank is arranged on the end ring between an end ring connection point of the first leg and an end ring connection point of the second leg, the first capacitor bank having at least two split capacitors not all belonging to the same end ring capacitance position. A second capacitor bank is arranged on the end ring between an end ring connection point of the third leg and an end ring connection point of the fourth leg. The second capacitor bank has at least two split capacitors not all belonging to the same end ring capacitance position.

In an embodiment, the first capacitor bank has a first split capacitor and a second split capacitor which are connected in series. The second capacitor bank has a third split capacitor and a fourth split capacitor, which are connected in series.

In another embodiment, the first split capacitor and an adjacent capacitor connected in series with the first split capacitor together form an equivalent capacitance of an end ring capacitance position to which the first split capacitor belongs. The second split capacitor and an adjacent capacitor connected in series with the second split capacitor together form an equivalent capacitance of an end ring capacitance position to which the second split capacitor belongs. The third split capacitor and an adjacent capacitor connected in series with the third split capacitor together form an equivalent capacitance of an end ring capacitance position to which the third split capacitor belongs. The fourth split capacitor and an adjacent capacitor connected in series with the fourth split capacitor together form an equivalent capacitance of an end ring capacitance position to which the fourth split capacitor belongs.

In another embodiment, the first capacitor bank has a first split capacitor, a second split capacitor and a third split capacitor, which are connected in series, wherein the first split capacitor and the second split capacitor belong to the same end ring capacitance position, and the third split capacitor does not belong to the end ring capacitance position to which the first split capacitor and the second split capacitor belong. The second capacitor bank has a fourth split capacitor, a fifth split capacitor and a sixth split capacitor which are connected in series, wherein the fourth split capacitor and the fifth split capacitor belong to the same end ring capacitance position, and the sixth split capacitor does not belong to the end ring capacitance position to which the fourth split capacitor and the fifth split capacitor belong. An adjacent capacitor connected in series with the first split capacitor, the first split capacitor and the second split capacitor together form an equivalent capacitance of the end ring capacitance position to which the first split capacitor and the second split capacitor belong; the third split capacitor and two adjacent capacitors connected sequentially in series with the third split capacitor together form an equivalent capacitance of an end ring capacitance position to which the third split capacitor belongs. An adjacent capacitor connected in series with the fourth split capacitor, the fourth split capacitor and the fifth split capacitor together form an equivalent capacitance of the end ring capacitance position to which the fourth split capacitor and the fifth split capacitor belong. The sixth split capacitor and two adjacent capacitors connected sequentially in series with the sixth split capacitor together form an equivalent capacitance of an end ring capacitance position to which the sixth split capacitor belongs.

A magnetic resonance imaging system in accordance with the invention has any of the atypical coil assemblies described above.

in accordance with the present invention, in view of the asymmetrical nature of the atypical coil end ring, at least two split capacitors not all belonging to the same end ring capacitance position are arranged between the end ring connection points, and by adjusting the number of split capacitors and the values of the split capacitors, the electrical properties of the ports can be adjusted; hence the freedom of adjustment of electrical orthogonality between the ports is increased, and the homogeneity of the $B_1$ field can be improved.

Furthermore, by equivalently splitting a capacitance at an end ring capacitance position into a number of series-connected capacitors, the capacitance value at a periphery of an end ring connection point can be increased, so the specific absorption rate (SAR) of the port is also improved.

DESCRIPTION OF THE PREFERRED EMBODIMENTS

The present invention is explained in further detail below in conjunction with the accompanying drawings and embodiments, to clarify the technical solution and advantages thereof. It should be understood that the particular embodiments described here are merely intended to explain the present invention, not to define the scope of protection thereof.

Figure 1:
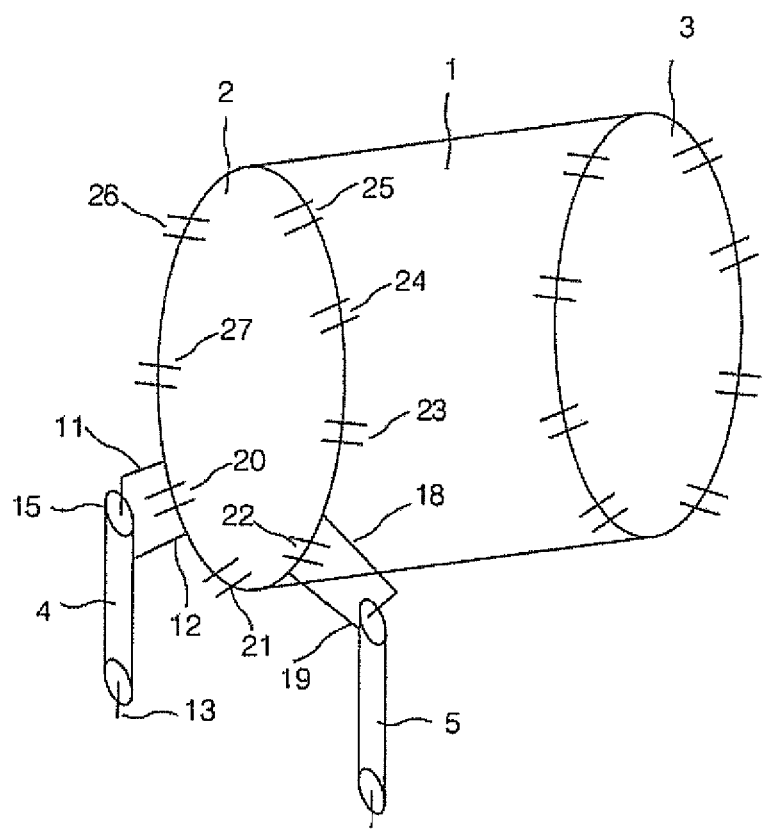
FIG. 1 schematically illustrates the structure of a typical coil and a port structure thereof in the prior art.

FIG. 1 schematically shows a typical coil and a port structure thereof in the prior art.

In FIG. 1, the typical coil is a coil body 1 and two typical (i.e. circular) end rings located at two sides of the coil body 1, specifically an end ring 2 and an end ring 3.

The end ring 2 and end ring 3 each have 8 end ring capacitance positions arranged at equal intervals thereon, with an equivalent capacitance arranged at each end ring capacitance position. The values of the equivalent capacitances at all of the end ring capacitance positions may be equal or different.

Taking end ring 2 as an example, an end ring capacitance position 20, an end ring capacitance position 21, an end ring capacitance position 22, an end ring capacitance position 23, an end ring capacitance position 24, an end ring capacitance position 25, an end ring capacitance position 26 and an end ring capacitance position 27 are included on the end ring. The end ring capacitance position 20, end ring capacitance position 21, end ring capacitance position 22, end ring capacitance position 23, end ring capacitance position 24, end ring capacitance position 25, end ring capacitance position 26 and end ring capacitance position 27 each have an equivalent capacitance arranged thereon. A port structure of the typical coil comprises two ports, specifically a port 4 and a port 5 which are connected to the end ring 2.

The port 4 and port 5 have the same structure. Taking port 4 as an example, an input end 13 of port 4 is connected to a power input source, and a pin end 15 of port 4 has two legs, specifically a leg 11 and a leg 12. Similarly, an input end of port 5 is connected to a power input source, and a pin end of port 5 likewise has two legs, specifically a leg 18 and a leg 19.

The two legs of port 4 span an end ring capacitance position on end ring 2, and the two legs of port 5 span an end ring capacitance position on end ring 2. In FIG. 1, leg 11 and leg 12 of port 4 span end ring capacitance position 20, and leg 18 and leg 19 of port 5 span end ring capacitance position 22.

In the structure shown in FIG. 1, three end ring capacitance positions (specifically, end ring capacitance position 20, end ring capacitance position 21 and end ring capacitance position 22) are spanned between port 4 and port 5; this is equivalent to port 4 and port 5 being arranged on end ring 2 at an interval of 90 degrees. Since end ring 2 is a circle having a symmetrical structure, such a structure can guarantee electrical orthogonality of port 4 and port 5, so as to optimize the homogeneity of the $B_1$ field.

However, since an end ring of an atypical coil is not circular, when the port structure shown in FIG. 1 is applied directly to an atypical coil, the homogeneity of the $B_1$ field cannot be optimized.

In an embodiment of the present invention, based on the principle of capacitance equivalence, in the case of an atypical coil, an equivalent capacitance at an end ring capacitance position adjacent to a port is split into multiple split capacitances. The specific manner of splitting may be:

(1), splitting an equivalent capacitance at an end ring capacitance position adjacent to a port into multiple series-connected split capacitors;

(2), splitting an equivalent capacitance at an end ring capacitance position adjacent to a port into multiple parallel-connected split capacitors;

(3) splitting an equivalent capacitance at an end ring capacitance position adjacent to a port into multiple split capacitors having a mixed series-connected and parallel-connected structure.

A particular embodiment of splitting an equivalent capacitance at an end ring capacitance position adjacent to a port into multiple split capacitors is described demonstratively above, but those skilled in the art will realize that such a description is merely demonstrative, and not intended to limit the scope of protection of embodiments of the present invention.

In another embodiment of the present invention, in the case of an atypical coil, at least two split capacitors not all belonging to the same end ring capacitance position are included between two legs of a port. By adjusting the number of split capacitors and the split capacitor values between two legs of a port, it is possible to flexibly adjust the electrical properties of each port, so as to increase the freedom of adjustment of electrical orthogonality between ports, making it easier to increase the homogeneity of the $B_1$ field.

Figure 2:
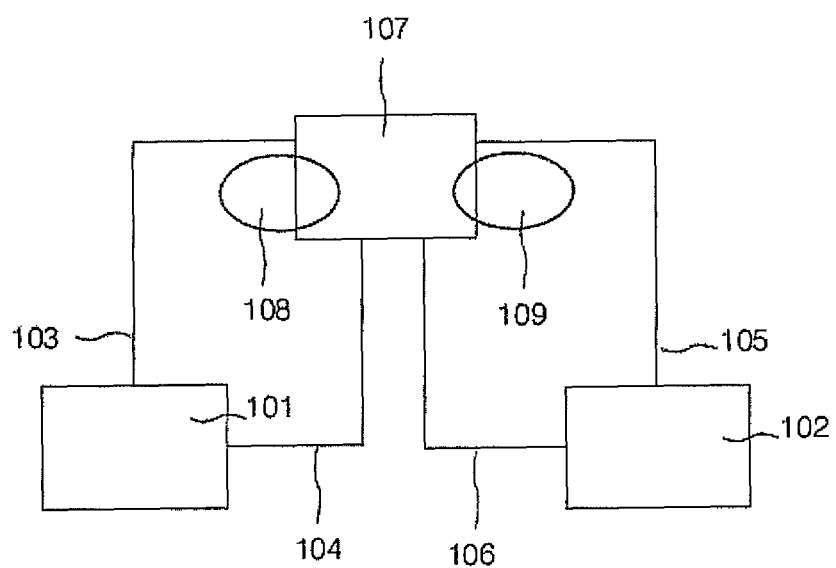
FIG. 2 schematically illustrates the structure of an end ring port structure of an atypical coil according to the present invention.

FIG. 2 schematically shows an end ring port structure of an atypical coil according to the present invention.

As shown in FIG. 2, the port structure of the atypical coil has an end ring 107 of the atypical coil, provided with multiple end ring capacitance positions for disposing equivalent capacitances, with a portion of the equivalent capacitances being formed by two or more split capacitors. The port structure further has a first port 101, having a first leg 103 and a second leg 104 which are each connected to the end ring 107 of the atypical coil, and a second port 102, having a third leg 105 and a fourth leg 106 that are each connected to the end ring 107. A first capacitor bank 108 is arranged on the end ring 107 between an end ring connection point of the first leg 103 and an end ring connection point of the second leg 104, the first capacitor bank 108 having at least two split capacitors not all belonging to the same end ring capacitance position. A second capacitor bank 109 is arranged on the end ring 107 between an end ring connection point of the third leg 105 and an end ring connection point of the fourth leg 106. The second capacitor bank 109 having at least two split capacitors not all belonging to the same end ring capacitance position.

Here, in view of the asymmetrical nature of the atypical coil end ring, a capacitor bank is arranged between the two legs of each port, each capacitor bank comprising at least two split capacitors not all belonging to the same end ring capacitance position. By adjusting the number of split capacitors in each capacitor bank and the capacitance values of the split capacitors in the capacitor banks, it is possible to flexibly adjust the electrical properties of each port, so as to adjust electrical orthogonality between ports, and improve the homogeneity of the $B_1$ field.

Furthermore, by equivalently splitting a capacitance at an end ring capacitance position adjacent to a port into multiple series-connected split capacitors, the capacitance value at a periphery of an end ring connection point is increased, so it is also possible to improve the specific absorption rate of the port.

For example, the number of series-connected split capacitors included in the first capacitor bank 108 may be 2, 3 . . . or a greater number. Similarly, the number of series-connected split capacitors included in the second capacitor bank 109 may be 2, 3 . . . or a greater number. To realize electrical orthogonality between ports, the number of series-connected split capacitors included in the second capacitor bank 109 should be kept the same as the number of series-connected split capacitors included in the first capacitor bank 108.

In an embodiment, the first capacitor bank 108 has a first capacitor and a second capacitor that are series-connected. The second capacitor bank 109 has a third capacitor and a fourth capacitor, which are series-connected. The first capacitor and an adjacent capacitor connected in series with the first capacitor together form an equivalent capacitance of an end ring capacitance position to which the first capacitor belongs. The second capacitor and an adjacent capacitor connected in series with the second capacitor together form an equivalent capacitance of an end ring capacitance position to which the second capacitor belongs. The third capacitor and an adjacent capacitor connected in series with the third capacitor together form an equivalent capacitance of an end ring capacitance position to which the third capacitor belongs. The fourth capacitor and an adjacent capacitor connected in series with the fourth capacitor together form an equivalent capacitance of an end ring capacitance position to which the fourth capacitor belongs.

Here, by setting the number of series-connected split capacitors to be two, the complexity of the split capacitors can be reduced.

In another embodiment, the first capacitor bank has a first capacitor, a second capacitor and a third capacitor which are connected in series. The first capacitor and the second capacitor belong to the same end ring capacitance position, and the third capacitor does not belong to the end ring capacitance position to which the first capacitor and the second capacitor belong. The second capacitor bank has a fourth capacitor, a fifth capacitor and a sixth capacitor which are connected in series. The fourth capacitor and the fifth capacitor belong to the same end ring capacitance position, and the sixth capacitor does not belong to the end ring capacitance position to which the fourth capacitor and the fifth capacitor belong. An adjacent capacitor connected in series with the first capacitor, the first capacitor and the second capacitor together form an equivalent capacitance of the end ring capacitance position to which the first capacitor and the second capacitor belong. The third capacitor and two adjacent capacitors connected sequentially in series with the third capacitor together form an equivalent capacitance of an end ring capacitance position to which the third capacitor belongs. An adjacent capacitor connected in series with the fourth capacitor, the fourth capacitor and the fifth capacitor together form an equivalent capacitance of the end ring capacitance position to which the fourth capacitor and the fifth capacitor belong. The sixth capacitor and two adjacent capacitors connected sequentially in series with the sixth capacitor together form an equivalent capacitance of an end ring capacitance position to which the sixth capacitor belongs.

Here, by setting the number of series-connected split capacitors to be three, the flexibility of adjustment of the port electrical properties can be further increased.

Embodiments of the present invention have been described in detail above, taking series-connected split capacitors as an example. Those skilled in the art will realize that such a description is merely demonstrative, and not intended to limit the scope of protection of embodiments of the present invention.

Figure 3:
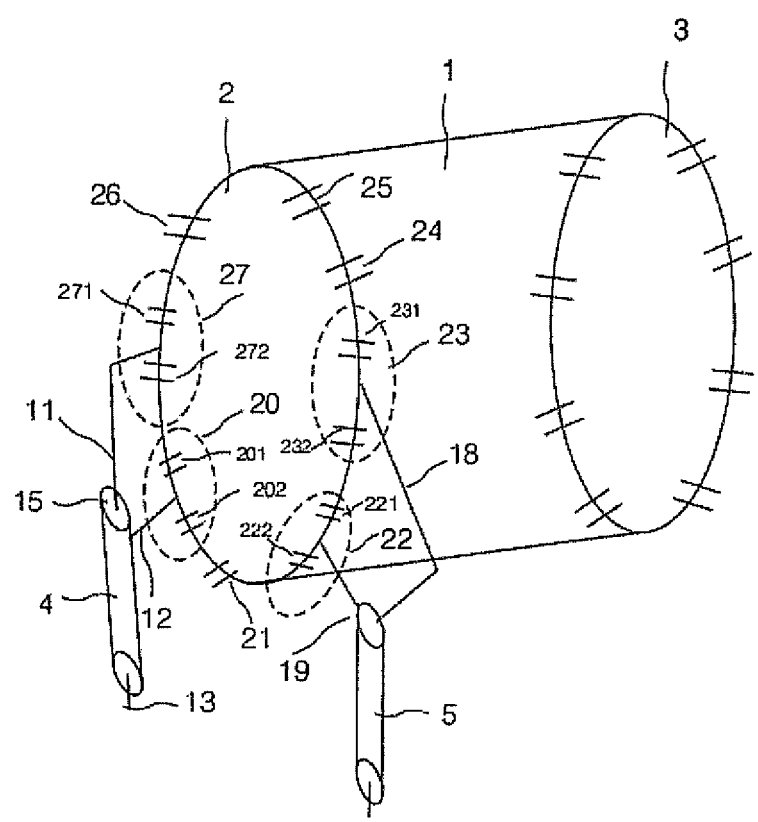
FIG. 3 schematically illustrates the structure of an atypical coil assembly according to a first embodiment of the present invention.

FIG. 3 schematically illustrates an atypical coil assembly according to a first embodiment of the present invention.

As shown in FIG. 3, the atypical coil assembly has a coil body 1 and two atypical (i.e. non-circular) end rings located at two sides of the coil body 1, specifically an end ring 2 and an end ring 3. The end ring 2 and end ring 3 each have 8 end ring capacitance positions arranged at substantially equal intervals thereon, with an equivalent capacitance arranged at each end ring capacitance position. The values of the equivalent capacitances at all of the end ring capacitance positions may be equal or different.

Taking end ring 2 as an example for illustration, end ring 2 has an end ring capacitance position 20, an end ring capacitance position 21, an end ring capacitance position 22, an end ring capacitance position 23, an end ring capacitance position 24, an end ring capacitance position 25, an end ring capacitance position 26 and an end ring capacitance position 27. The end ring capacitance position 20, end ring capacitance position 21, end ring capacitance position 22, end ring capacitance position 23, end ring capacitance position 24, end ring capacitance position 25, end ring capacitance position 26 and end ring capacitance position 27 each have an equivalent capacitance arranged thereon. Similarly, end ring 3 has a similar structure, which is not described superfluously here.

The atypical coil assembly also has two ports, specifically a port 4 and a port 5.

The port 4 and port 5 have the same structure. Taking port 4 as an example, an input end 13 of port 4 is connected to a power input source, and a pin end 15 of port 4 has two legs, specifically a leg 11 and a leg 12. Similarly, an input end of port 5 is connected to a power input source, and a pin end of port 5 likewise has two legs, specifically a leg 18 and a leg 19.

Port 4 and port 5 are both connected to one end ring. For example, port 4 and port 5 may be connected to end ring 2, but may also be connected to end ring 3.

It is assumed that port 4 and port 5 are both connected to end ring 2.

An equivalent capacitance at end ring capacitance position 27 close to port 4 is split into two series-connected split capacitors, specifically a split capacitor 271 and a split capacitor 272. Suppose that the value of the equivalent capacitance at end ring capacitance position 27 is C27; then a capacitance value C271 of split capacitor 271 and a capacitance value C272 of split capacitor 272 satisfy: C27=(C271×C272)/(C271+C272).

A capacitance at end ring capacitance position 20 close to port 4 is split into two series-connected split capacitors, specifically a split capacitor 201 and a split capacitor 202. Suppose that the value of the equivalent capacitance at end ring capacitance position 20 is C20; then a capacitance value C201 of split capacitor 201 and a capacitance value C202 of split capacitor 202 satisfy: C20=(C201×C202)/(C201+C202).

A capacitance at end ring capacitance position 22 close to port 5 is split into two series-connected split capacitors, specifically a split capacitor 221 and a split capacitor 222. Suppose that the value of the equivalent capacitance at end ring capacitance position 22 is C22; then a capacitance value C221 of split capacitor 221 and a capacitance value C222 of split capacitor 222 satisfy: C20=(C221×C222)/(C221+C222).

A capacitance at end ring capacitance position 23 close to port 5 is split into two series-connected split capacitors, specifically a split capacitor 231 and a split capacitor 232. Suppose that the value of the equivalent capacitance at end ring capacitance position 23 is C23; then a capacitance value C231 of split capacitor 231 and a capacitance value C232 of split capacitor 232 satisfy: C23=(C231×C232)/(C231+C232).

As shown in FIG. 3, the two legs of port 4 span multiple end ring capacitance positions on end ring 2, and the two legs of port 5 span multiple end ring capacitance positions on end ring 2. Specifically, leg 11 and leg 12 of port 4 span end ring capacitance position 27 and end ring capacitance position 20, and leg 18 and leg 19 of port 5 span end ring capacitance position 22 and end ring capacitance position 23. More specifically, leg 11 and leg 12 of port 4 span split capacitor 272 and split capacitor 201, wherein split capacitor 272 belongs to end ring capacitance position 27, and split capacitor 201 belongs to end ring capacitance position 20. Leg 18 and leg 19 of port 5 span split capacitor 221 and split capacitor 232, wherein split capacitor 221 belongs to end ring capacitance position 22, and split capacitor 232 belongs to end ring capacitance position 23.

By adjusting the capacitance values of split capacitor 272 and split capacitor 201, the electrical properties of port 4 can be adjusted; by adjusting the capacitance values of split capacitor 221 and split capacitor 232, the electrical properties of port 5 can be adjusted. Thus, the freedom of adjustment of electrical orthogonality between port 4 and port 5 is increased in an embodiment of the present invention. In practice, by adjusting the respective capacitance values of split capacitor 272, split capacitor 201, split capacitor 221 and split capacitor 232 to appropriate values, electrical orthogonality of port 4 and port 5 can be realized, so as to increase the homogeneity of the $B_1$ field.

In the example above, the case where 8 end ring capacitance positions are arranged on the end ring is taken as an example for illustration. In practice, the specific number of end ring capacitance positions on the end ring can be adjusted; no restrictions are imposed in this respect in embodiments of the present invention.

In the example above, each port spans two split capacitors belonging to different end ring capacitance positions. An embodiment of the present invention is explained below, taking as an example the case where each port spans three split capacitors belonging to different end ring capacitance positions.

Figure 4:
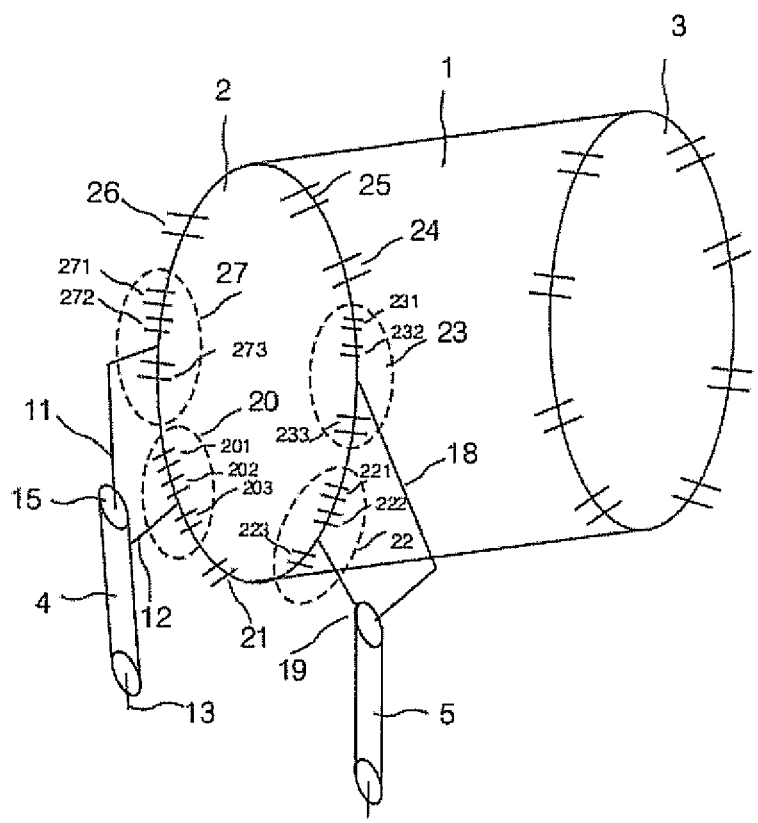
FIG. 4 schematically illustrates an atypical coil assembly according to a second embodiment of the present invention.

FIG. 4 schematically shows an atypical coil assembly according to a second embodiment of the present invention.

As shown in FIG. 4, the atypical coil assembly comprises a coil body 1 and two atypical (i.e. non-circular) end rings located at two sides of the coil body 1, specifically an end ring 2 and an end ring 3. The end ring 2 and end ring 3 each have 8 end ring capacitance positions arranged at substantially equal intervals thereon, with a capacitance arranged at each end ring capacitance position. The values of the equivalent capacitances at all of the end ring capacitance positions may be equal or different.

Taking end ring 2 as an example for illustration, end ring 2 comprises an end ring capacitance position 20, an end ring capacitance position 21, an end ring capacitance position 22, an end ring capacitance position 23, an end ring capacitance position 24, an end ring capacitance position 25, an end ring capacitance position 26 and an end ring capacitance position 27. The end ring capacitance position 20, end ring capacitance position 21, end ring capacitance position 22, end ring capacitance position 23, end ring capacitance position 24, end ring capacitance position 25, end ring capacitance position 26 and end ring capacitance position 27 each have an equivalent capacitance arranged thereon. End ring 3 has a similar structure, which is not described superfluously here.

The atypical coil assembly also has two ports, specifically a port 4 and a port 5.

The port 4 and port 5 have the same structure. Taking port 4 as an example, an input end 13 of port 4 is connected to a power input source, and a pin end 15 of port 4 has two legs, specifically a leg 11 and a leg 12. Similarly, an input end of port 5 is connected to a power input source, and a pin end of port 5 likewise has two legs, specifically a leg 18 and a leg 19.

Port 4 and port 5 are both connected to one end ring. For example, port 4 and port 5 may be connected to end ring 2, but may also be connected to end ring 3.

It is assumed that port 4 and port 5 are connected to end ring 2.

An equivalent capacitance at end ring capacitance position 27 close to port 4 is split into three series-connected split capacitors, specifically a split capacitor 271, a split capacitor 272 and a split capacitor 273. Suppose that the value of the equivalent capacitance at end ring capacitance position 27 is C27; then a capacitance value C271 of split capacitor 271, a capacitance value C272 of split capacitor 272 and a capacitance value C273 of split capacitor 273 satisfy: $C27=(C271\times C272\times C273)/(C271\times C272+C271\times C273+C272\times C273)$.

An equivalent capacitance at end ring capacitance position 20 close to port 4 is split into three series-connected split capacitors, specifically a split capacitor 201, a split capacitor 202 and a split capacitor 203. Suppose that the value of the equivalent capacitance at end ring capacitance position 20 is C20; then a capacitance value C201 of split capacitor 201, a capacitance value C202 of split capacitor 202 and a capacitance value C203 of split capacitor 203 satisfy: $C20=(C201\times C202\times C203)/(C201\times C202+C201\times C203+C202\times C203)$.

An equivalent capacitance at end ring capacitance position 22 close to port 5 is split into three series-connected split capacitors, specifically a split capacitor 221, a split capacitor 222 and a split capacitor 223. Suppose that the value of the equivalent capacitance at end ring capacitance position 22 is C22; then a capacitance value C221 of split capacitor 221, a capacitance value C222 of split capacitor 222 and a capacitance value C223 of split capacitor 223 satisfy: $C22=(C221\times C222\times C223)/(C221\times C222+C221\times C223+C222\times C223)$.

An equivalent capacitance at end ring capacitance position 23 close to port 5 is split into three series-connected split capacitors, specifically a split capacitor 231, a split capacitor 232 and a split capacitor 233. Suppose that the value of the equivalent capacitance at end ring capacitance position 23 is C23; then a capacitance value C231 of split capacitor 231, a capacitance value C232 of split capacitor 232 and a capacitance value C233 of split capacitor 233 satisfy: $C23=(C223\times C232\times C233)/(C231\times C232+C231\times C233+C232\times C233)$.

As shown in FIG. 4, the two legs of port 4 span multiple end ring capacitance positions on end ring 2, and the two legs of port 5 span multiple end ring capacitance positions on end ring 2. Specifically: leg 11 and leg 12 of port 4 span split capacitor 273, split capacitor 201 and split capacitor 202, wherein split capacitor 273 belongs to end ring capacitance position 27, whereas split capacitor 201 and split capacitor 202 both belong to end ring capacitance position 20. Leg 18 and leg 19 of port 5 span split capacitor 233, split capacitor 221 and split capacitor 222, wherein split capacitor 233 belongs to end ring capacitance position 23, whereas split capacitor 221 and split capacitor 222 both belong to end ring capacitance position 22.

By adjusting the capacitance values of split capacitor 273, split capacitor 201 and split capacitor 202, the electrical properties of port 4 can be adjusted; by adjusting the capacitance values of split capacitor 221, split capacitor 222 and split capacitor 233, the electrical properties of port 5 can be adjusted. Thus, the freedom of adjustment of electrical orthogonality between port 4 and port 5 is increased in an embodiment of the present invention. In practice, by adjusting the respective capacitance values of split capacitor 273, split capacitor 201, split capacitor 202, split capacitor 221, split capacitor 222 and split capacitor 233 to appropriate values, electrical orthogonality of port 4 and port 5 can be realized, so as to increase the homogeneity of the $B_1$ field.

In the example above, the case where 8 end ring capacitance positions are arranged on the end ring is taken as an example for illustration. In practice, the specific number of end ring capacitance positions on the end ring can be adjusted; no restrictions are imposed in this respect in embodiments of the present invention.

In the example above, each port spans three split capacitors belonging to different end ring capacitance positions. In practice, each port could also span a greater number of split capacitors, etc. No restrictions are imposed in this respect in embodiments of the present invention.

The end ring port structure and coil assemblies of atypical coils described in FIGS. 2-4 may be applied in MRI systems of various types. Preferably, an atypical coil may be implemented as a birdcage coil or a D-shaped coil, etc.

In summary, an end ring port structure in an embodiment of the present invention has an end ring, provided with multiple end ring capacitance positions for disposing equivalent capacitances, with a portion of the equivalent capacitances being formed by two or more split capacitors; a first port, comprising a first leg and a second leg which are each connected to the end ring of the atypical coil; a second port, comprising a third leg and a fourth leg which are each connected to the end ring, wherein a first capacitor bank is arranged on the end ring between an end ring connection point of the first leg and an end ring connection point of the second leg, the first capacitor bank comprising at least two split capacitors not all belonging to the same end ring capacitance position; a second capacitor bank is arranged on the end ring between an end ring connection point of the third leg and an end ring connection point of the fourth leg, the second capacitor bank comprising at least two split capacitors not all belonging to the same end ring capacitance position. It can be seen therefrom that in an embodiment of the present invention, in view of the asymmetrical nature of the atypical coil end ring, at least two split capacitors not all belonging to the same end ring capacitance position are arranged between the end ring connection points, and by adjusting the number of split capacitors and the values of the split capacitors, the electrical properties of the ports can be adjusted; hence the freedom of adjustment of electrical orthogonality between the two ports is increased, and the homogeneity of the $B_1$ field can be improved.

Furthermore, by equivalently splitting a capacitance at an end ring capacitance position into a number of series-connected capacitors, the capacitance value at a periphery of an end ring connection point can be increased, so the specific absorption rate of the port is also improved.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. An end ring port structure of an atypical coil, comprising:
    an end ring having multiple end ring capacitance positions for disposing equivalent capacitances, with a portion of the equivalent capacitances being formed by two or more split capacitors;
    a first port, comprising a first leg and a second leg which are each connected to the end ring;
    a second port, comprising a third leg and a fourth leg which are each connected to the end ring,
    a first capacitor bank on the end ring between an end ring connection point of the first leg and an end ring connection point of the second leg, the first capacitor bank comprising at least two split capacitors not all belonging to the same end ring capacitance position; and
    a second capacitor bank on the end ring between an end ring connection point of the third leg and an end ring connection point of the fourth leg, the second capacitor bank comprising at least two split capacitors not all belonging to the same end ring capacitance position.

2. The end ring port structure of an atypical coil as claimed in claim 1, wherein:
    the first capacitor bank comprises a first split capacitor and a second split capacitor which are connected in series; and
    the second capacitor bank comprises a third split capacitor and a fourth split capacitor which are connected in series.

3. The end ring port structure of an atypical coil as claimed in claim 2 wherein:
    the first split capacitor and an adjacent capacitor connected in series with the first split capacitor together form an equivalent capacitance of an end ring capacitance position to which the first split capacitor belongs;
    the second split capacitor and an adjacent capacitor connected in series with the second split capacitor together form an equivalent capacitance of an end ring capacitance position to which the second split capacitor belongs;
    the third split capacitor and an adjacent capacitor connected in series with the third split capacitor together form an equivalent capacitance of an end ring capacitance position to which the third split capacitor belongs; and
    the fourth split capacitor and an adjacent capacitor connected in series with the fourth split capacitor together form an equivalent capacitance of an end ring capacitance position to which the fourth split capacitor belongs.

4. The end ring port structure of an atypical coil as claimed in claim 1 wherein:
    the first capacitor bank comprises a first split capacitor, a second split capacitor and a third split capacitor which are connected in series, wherein the first split capacitor and the second split capacitor belong to the same end ring capacitance position, and the third split capacitor does not belong to the end ring capacitance position to which the first split capacitor and the second split capacitor belong; and
    the second capacitor bank comprises a fourth split capacitor, a fifth split capacitor and a sixth split capacitor, which are connected in series, wherein the fourth split capacitor and the fifth split capacitor belong to the same end ring capacitance position, and the sixth split capacitor does not belong to the end ring capacitance position to which the fourth split capacitor and the fifth split capacitor belong.

5. The end ring port structure of an atypical coil as claimed in claim 4, wherein:
    an adjacent capacitor connected in series with the first split capacitor, the first split capacitor and the second split capacitor together form an equivalent capacitance of the end ring capacitance position to which the first split capacitor and the second split capacitor belong;
    the third split capacitor and two adjacent capacitors connected sequentially in series with the third split capacitor together form an equivalent capacitance of an end ring capacitance position to which the third split capacitor belongs;
    an adjacent capacitor connected in series with the fourth split capacitor, the fourth split capacitor and the fifth split capacitor together form an equivalent capacitance of the end ring capacitance position to which the fourth split capacitor and the fifth split capacitor belong; and
    the sixth split capacitor and two adjacent capacitors connected sequentially in series with the sixth split capacitor together form an equivalent capacitance of an end ring capacitance position to which the sixth split capacitor belongs.

6. An atypical coil assembly, comprising:
    an atypical coil comprising an end ring, the end ring being provided with multiple end ring capacitance positions for disposing equivalent capacitances, with a portion of the equivalent capacitances being formed by two or more split capacitors;
    a first port, comprising a first leg and a second leg which are each connected to the end ring;
    a second port, comprising a third leg and a fourth leg which are each connected to the end ring,
    a first capacitor bank on the end ring between an end ring connection point of the first leg and an end ring connection point of the second leg, the first capacitor bank comprising at least two split capacitors not all belonging to the same end ring capacitance position; and a second capacitor bank is arranged on the end ring between an end ring connection point of the third leg and an end ring connection point of the fourth leg, the second capacitor bank comprising at least two split capacitors not all belonging to the same end ring capacitance position.

7. The atypical coil assembly as claimed in claim 6, wherein:

the first capacitor bank comprises a first split capacitor and a second split capacitor which are connected in series; and the second capacitor bank comprises a third split capacitor and a fourth split capacitor which are connected in series.

8. The atypical coil assembly as claimed in claim 6, wherein:

the first split capacitor and an adjacent capacitor connected in series with the first split capacitor together form an equivalent capacitance of an end ring capacitance position to which the first split capacitor belongs;

the second split capacitor and an adjacent capacitor connected in series with the second split capacitor together form an equivalent capacitance of an end ring capacitance position to which the second split capacitor belongs;

the third split capacitor and an adjacent capacitor connected in series with the third split capacitor together form an equivalent capacitance of an end ring capacitance position to which the third split capacitor belongs; and the fourth split capacitor and an adjacent capacitor connected in series with the fourth split capacitor together form an equivalent capacitance of an end ring capacitance position to which the fourth split capacitor belongs.

9. The atypical coil assembly as claimed in claim 6, wherein:

the first capacitor bank comprises a first split capacitor, a second split capacitor and a third split capacitor which are connected in series, wherein the first split capacitor and the second split capacitor belong to the same end ring capacitance position, and the third split capacitor does not belong to the end ring capacitance position to which the first split capacitor and the second split capacitor belong;

the second capacitor bank comprises a fourth split capacitor, a fifth split capacitor and a sixth split capacitor, which are connected in series, wherein the fourth split capacitor and the fifth split capacitor belong to the same end ring capacitance position, and the sixth split capacitor does not belong to the end ring capacitance position to which the fourth split capacitor and the fifth split capacitor belong;

an adjacent capacitor connected in series with the fourth split capacitor, the fourth split capacitor and the fifth split capacitor together form an equivalent capacitance of the end ring capacitance position to which the fourth split capacitor and the fifth split capacitor belong; and the sixth split capacitor and two adjacent capacitors connected sequentially in series with the sixth split capacitor together form an equivalent capacitance of an end ring capacitance position to which the sixth split capacitor belongs.

10. A magnetic resonance imaging system, comprising:

a magnetic resonance data acquisition scanner comprising an atypical coil;

said atypical coil comprising an end ring, the end ring being provided with multiple end ring capacitance positions for disposing equivalent capacitances, with a portion of the equivalent capacitances being formed by two or more split capacitors;

a first port, comprising a first leg and a second leg which are each connected to the end ring;

a second port, comprising a third leg and a fourth leg which are each connected to the end ring, a first capacitor bank on the end ring between an end ring connection point of the first leg and an end ring connection point of the second leg, the first capacitor bank comprising at least two split capacitors not all belonging to the same end ring capacitance position; and a second capacitor bank is arranged on the end ring between an end ring connection point of the third leg and an end ring connection point of the fourth leg, the second capacitor bank comprising at least two split capacitors not all belonging to the same end ring capacitance position.

\* \* \* \* \*